United States Patent [19]
Schmitt et al.

[11] Patent Number: 6,088,222
[45] Date of Patent: Jul. 11, 2000

[54] COMPUTER PERIPHERAL CHASSIS FRAME STRUCTURE HAVING A SPLIT LANCE FOR LOCATION, ELECTRICAL GROUNDING, AND LOAD BEARING OF CHASSIS CARRIERS

[75] Inventors: Ty R. Schmitt, Round Rock; Arthur Lopez, Austin, both of Tex.

[73] Assignee: Dell USA, L.P., Round Rock, Tex.

[21] Appl. No.: 08/999,786

[22] Filed: Nov. 5, 1997

Related U.S. Application Data

[63] Continuation-in-part of application No. 08/748,850, Nov. 14, 1996, Pat. No. 5,691,879.

[51] Int. Cl.$^7$ .................................. G06F 1/16; H05K 7/00
[52] U.S. Cl. .......................... 361/686; 361/685; 361/724; 361/727; 312/332.1; 312/333
[58] Field of Search .................................... 361/685, 683, 361/724–727, 818, 686; 364/708.1; 312/332.1, 333

[56] References Cited

U.S. PATENT DOCUMENTS

| | | | |
|---|---|---|---|
| 3,866,993 | 2/1975 | Dean et al. | 312/216 |
| 4,303,287 | 12/1981 | Taplin | 312/215 |
| 4,662,776 | 5/1987 | Hedstrom et al. | 403/387 |
| 4,685,312 | 8/1987 | Lakoski et al. | 70/14 |
| 5,019,932 | 5/1991 | Iwata | 360/105 |
| 5,077,722 | 12/1991 | Geist et al. | 369/75.1 |
| 5,112,119 | 5/1992 | Cooke et al. | 361/685 |
| 5,124,886 | 6/1992 | Golobay | 361/727 |
| 5,212,681 | 5/1993 | Bock et al. | 369/244 |
| 5,216,662 | 6/1993 | Stefansky et al. | 369/215 |
| 5,229,919 | 7/1993 | Chen | 361/391 |
| 5,277,615 | 1/1994 | Hastings et al. | 439/377 |
| 5,325,263 | 6/1994 | Singer et al. | 361/683 |
| 5,451,168 | 9/1995 | Shuey | 439/159 |
| 5,557,499 | 9/1996 | Reiter et al. | 361/685 |
| 5,579,204 | 11/1996 | Nelson et al. | 361/685 |
| 5,584,396 | 12/1996 | Schmitt | 361/727 |
| 5,586,003 | 12/1996 | Schmitt et al. | 361/683 |
| 5,588,728 | 12/1996 | Eldridge et al. | 312/332.1 |
| 5,652,695 | 7/1997 | Schmitt | 361/685 |
| 5,654,873 | 8/1997 | Smithson et al. | 361/685 |
| 5,668,696 | 9/1997 | Schmitt | 361/685 |
| 5,673,171 | 9/1997 | Varghese et al. | 361/685 |
| 5,673,172 | 9/1997 | Hastings et al. | 361/685 |
| 5,721,669 | 2/1998 | Becker et al. | 361/685 |

Primary Examiner—Leo P. Picard
Assistant Examiner—Lisa Lea-Edmonds
Attorney, Agent, or Firm—Skjerven, Morrill, MacPherson, Franklin & Friel, L.L.P.; Stephen A. Terrile

[57] ABSTRACT

A computer system includes a backplane printed circuit board and a peripheral device. The peripheral device is coupled to the backplane printed circuit board. The peripheral device is cradled within a chassis carrier. A grounding conductor is associated with the chassis carrier and peripheral device. A frame structure supports the chassis carrier. The frame structure includes peripheral device bays and split lances. The peripheral device bays are for receiving peripheral devices. One of the peripheral device bays includes the peripheral device and chassis carrier. The split lances are located on opposite internal sides of the frame structure for each peripheral device bay. Mounting rails may be coupled to the opposite internal sides of the frame over the split lances such that the split lances project through the mounting rails. The split lances electrically couple installed peripheral devices to ground, and locate and support the mounting rails and/or peripheral devices.

22 Claims, 17 Drawing Sheets

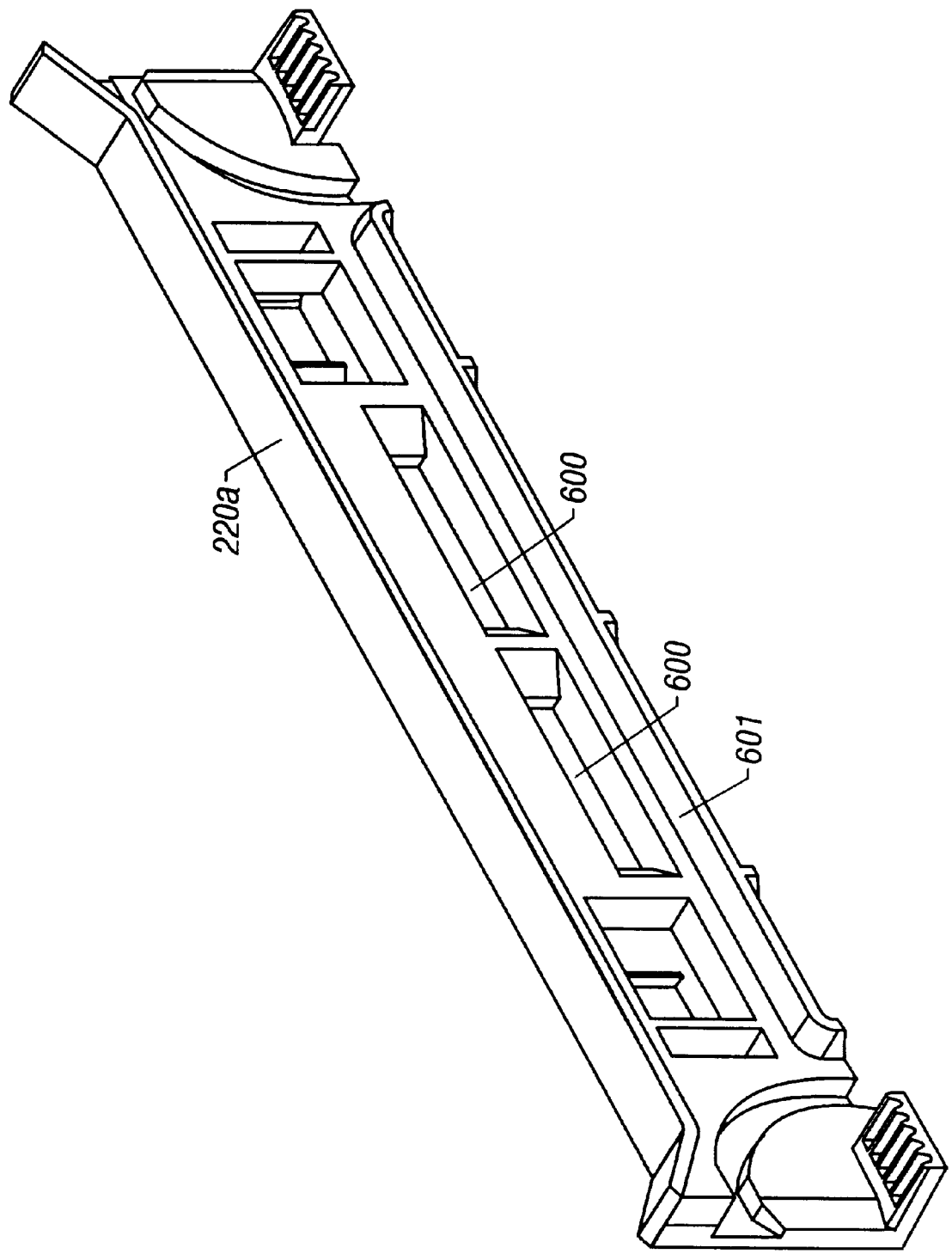

COMPUTER PERIPHERAL CHASSIS FRAME STRUCTURE HAVING A SPLIT LANCE FOR LOCATION, ELECTRICAL GROUNDING, AND LOAD BEARING OF CHASSIS CARRIERS

CROSS-REFERENCE TO RELATED APPLICATIONS

This application is a continuation-in-part of U.S. patent application Ser. No. 08/748,850, entitled "Locking Apparatus for Disk Drive Carriers," filed Nov. 14, 1996, now U.S. Pat. No. 5,691,879, naming Arthur Lopez and Steven L. Sands as inventors, and which is incorporated herein by reference in its entirety.

BACKGROUND

1. Field of the Invention

The present invention is directed, in general, to computer systems and, more specifically to a frame structure for mounting a computer peripheral device and chassis therefor within a bay in the frame.

2. Description of the Related Art

Computer systems are information handling systems which can be designed to give independent computing power to one user or a plurality of users. Computer systems may be found in many forms including, for example, mainframes, minicomputers, workstations, servers, personal computers, internet terminals, notebooks and embedded systems. Personal computer (PC) systems, such as the International Business Machines (IBM) compatible PC systems, include desk top, floor standing, or portable versions. A typical PC system is a microcomputer that includes a microprocessor, associated memory and control logic and a number of peripheral devices that provide input and output (I/O) for the system. Such peripheral devices often include multiple I/O devices such as display monitors, keyboards, pointer type input devices such as mice, touchpads and electronic pens, floppy and hard disk drives, compact disk read only memory (CD-ROM) drives and printers. Other I/O devices include various communication devices such as digital communication/network connection devices and modems, sound and video I/O devices such as speakers, microphones, voice recognition devices, digital cameras, scanners, televisions and videocassette recorders, and mass storage devices such as tape drives, CD-recordable (CD-R) drives or digital video/variable drives (DVDs).

As indicated, computer systems utilize a number of storage mediums and associated devices to store and provide data required by the system and its users. For example, a network server is a focal point for processing and storage in the network, as the network server is responsible for distribution of application programs and data to the client PCs. Since they must serve as a focal point, network servers are typically outfitted with the latest, fastest, largest central processing unit ("CPU"), buses and random access memory ("RAM"). Further, such network servers are provided with at least one (and almost always more than one) large, fast hard disk drive providing nonvolatile storage for the application programs and data.

Network servers often employ more than one disk drive for three reasons. First, storage needs may exceed the capacity of today's largest single drives. Second, large drives are often more expensive per unit of storage than smaller drives. Third, it is advantageous from the standpoint of reliability to spread the application programs and data over multiple disks such that, if one disk fails, all is not lost. In fact, it has been recognized that an array of relatively inexpensive disks may act in concert to provide nonvolatile storage that is faster and more reliable than a single large expensive disk drive.

The technology to enable such inexpensive disks to cooperate advantageously is generally known as Redundant Array of Inexpensive Disks ("RAID") and is particularly useful in the environment of network servers. RAID provides data redundancy, such that if a single disk drive fails, the data stored thereon can be reconstructed from the data stored on the remaining disks. There are several levels of RAID, depending upon the degree of speed and reliability desired. The reader is directed to widely-available publications on RAID and the advantages thereof, as a general description of RAID is outside the scope of the present discussion.

In the most sophisticated network servers, a failed disk drive can be replaced and the data thereon restored by software without interrupting the server's operation. In so-called "hot plugging," the failed disk drive is removed and a new one installed in its place without cutting off the power to the drive.

Typically, a network server is advantageously housed in a main chassis, most often in the form of a tower, containing multiple bays for receiving the various hard disk drives that comprise the network server's nonvolatile storage. It is desirable to provide a rapid, convenient means of installing disk drives in, and removing disk drives from, the bays. It is also desirable that these devices are easily accessible so as to not disturb the other devices or the system as a whole when they are inserted or removed. It is especially desirable in the context of RAID, wherein a drive may be hot-plugged into the bay. Accordingly, computer manufacturers have begun to provide external openings in computer chassis which provide direct access to the bays and the devices located therein without requiring access to other components of the computer system.

In order to insert these devices into their respective bays, carriers are frequently used as platforms to hold each device. These carriers are designed to secure each device and provide for smooth insertion into a bay and to assure a proper electrical connection between the device and the system. However, most carrier designs require the individual inserting the device to apply force directly to the carrier, either through pushing or pulling, to connect the device to the computer system, usually by a male connector on the back of the device and a female connector on a system board at the back of the bay. Further, in an attempt to insert or remove a device from the system, the individual often applies force to the device in a direction non-parallel to the connector. By application of such forces connector pins are often bent and the stress placed on the system board, into which the device is connected, can lead to system failures.

A well-designed structure for removably mounting a disk drive chassis within a bay should provide mechanics advantage for ease of insertion and removal of the chassis. This reduces the force a user is required to exert to install or remove the chassis. Second, such a structure should provide self-alignment for a carrier that cradles the chassis. Self-alignment ensures proper position and orientation for the chassis carrier and any movable parts associated with the chassis carrier (such as the mechanism affording mechanical advantage). Third, the structure should provide positive latching for retaining the chassis in place once installed. Fourth, the structure advantageously connects the chassis carrier to computer system ground. Fifth, the structure advantageously discharges static electricity.

FIG. 1A shows a computer system frame 100 which contains a plurality of bays 102, 104, 106. As shown, only bay 106 contains a hard disk drive chassis 114. Each bay 102, 104, 106 has mounted therein a pair of mounting rails 120a, 120b, 122a, 122b, 124a, 124b. The mounting rails 120a, 120b cooperate to provide a guide path within the bay 102 for a chassis carrier such as chassis carrier 134 in bay 106. Likewise, the mounting rails 122a, 122b and the mounting rails 124a, 124b cooperate to provide guide paths in the bays 104, 106 respectively, for other chassis carriers, including a chassis carrier 134 shown in a mounted position within the bay 106 and cradling the hard disk drive chassis 114.

Frame 100 includes lances 101, 103, 105 for each of bays 102, 104, 106, respectively. Lances 101, 103 and 105 are metal arcs depressed toward the inside of frame 100 by deforming the sheet metal surface of frame 100. The lances provide static discharge and grounding for electronic devices carried by chassis carriers inserted into the bays (e.g., chassis carrier 134). Each such lance is a contiguous strip of sheet metal deformed from the plane of sheet metal which is the surface of frame 100. Such lances have been found to neck down when deformed from the plane of the sheet metal. When the sheet metal is stretched, the sheet metal lance necks down such that material is taken from the width of the lance and displaced to accommodate the increased length of the lance. For example, as shown in FIG. 1B, the width of the lance decreases from a width A at the base of the lance to a necked down width of B nearer to the apex of the lance. Because such necking down occurs often but irregularly and unpredictably, prior art lances 101, 103, 105 cannot be used to reliably locate and secure, for example, a hard drive chassis or a mount for securing a hard drive chassis within frame 100.

SUMMARY

It has been discovered that split lance features may be incorporated in a computer system frame. The split lance features mate with snap or aperture features of a computer peripheral chassis frame structure or of a rail fastened thereto and are formed so as to provide static discharge and ground to an electronic device chassis carrier. Such a configuration reliably and repeatedly locates an electronic device (such as a removable disk drive) and a chassis carrier therefor in the computer system. Such a configuration provides the advantage that an electronic device chassis carrier is located and constrained to the chassis of the computer system without the use of fasteners or multiple parts. Furthermore, such a configuration provides the necessary strength to bear the load or weight of the entire electronic device carrier assembly during shock and vibration. Such a configuration also provides the advantage that static electricity of the electronic device is discharged prior to complete installation of the electronic device and that the electronic device is electrically grounded to the computer system upon insertion into the computer system.

In one embodiment, a computer system includes a backplane printed circuit board and a peripheral device. The peripheral device is coupled to the backplane printed circuit board. The peripheral device is cradled within a chassis carrier. A grounding conductor is associated with the chassis carrier and peripheral device. A frame structure supports the chassis carrier. The frame structure includes peripheral device bays and split lances. The peripheral device bays are for receiving peripheral devices. One of the peripheral device bays includes the peripheral device and chassis carrier. The split lances are located on opposite internal sides of the frame structure for each peripheral device bay. Mounting rails may be coupled to the opposite internal sides of the frame over the split lances such that the split lances project through the mounting rails. The split lances electrically couple installed peripheral devices to ground, and locate and support the mounting rails and/or peripheral devices.

In another embodiment, a frame and mounting apparatus is provided for use in a computer peripheral device bay. The apparatus includes a frame and a mounting rail. The frame has a surface and a split lance extending from the surface of the frame to an interior side of the frame. The mounting rail is coupled to the surface of the frame on the interior side of the frame. The mounting rail has at least one aperture allowing the split lance to pass therethrough. The mounting rail has a location determined by the location of the split lance.

In another embodiment, a method of grounding and locating a peripheral device in a computer system includes providing split lances on an interior surface of the computer system and installing a peripheral device in the computer system such that a grounding contact of the peripheral device is electrically coupled to a split lance and such that the location of the peripheral device is determined by the location of at least one of the split lances.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

FIG. 6A is a perspective view of the mounting rail which is attached to the frame structure.

DETAILED DESCRIPTION

The following sets forth a detailed description of the preferred embodiment(s) of the invention. The description is intended to be illustrative of the invention and should not be taken to be limiting. Many variations, modifications, additions, and improvements may fall within the scope of the invention as defined in the claims that follow.

Figure 1A:
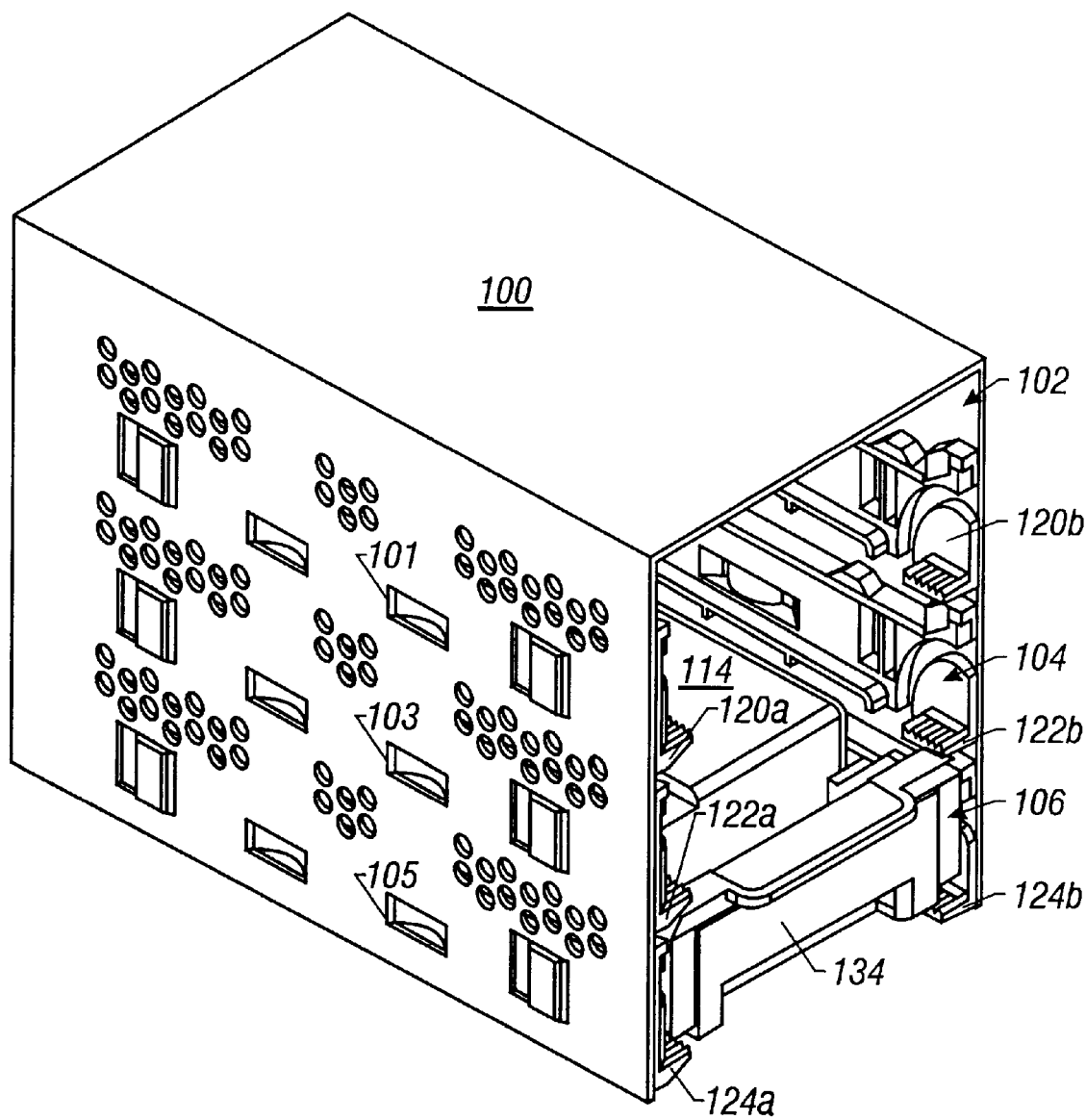
FIG. 1A is a perspective illustrating a prior art PC hard drive frame with multiple bays with mounting rails and with a hard drive chassis carrier inserted therein.
Figure 1B:
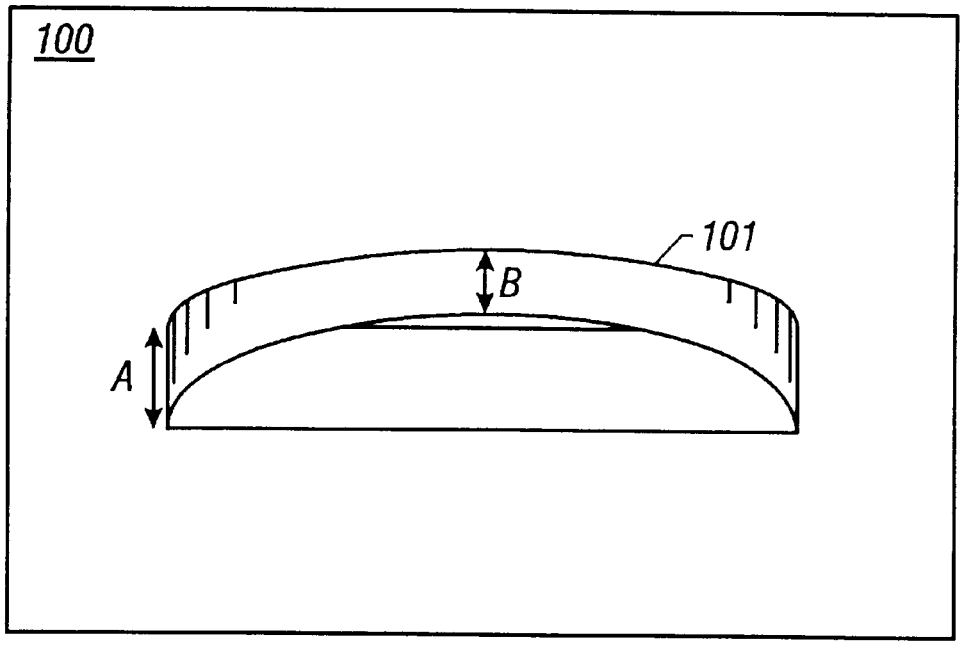
FIG. 1B is a close up view of a surface of the PC hard drive frame of FIG. 1A with a prior art lance incorporated thereon.
Figure 2B:
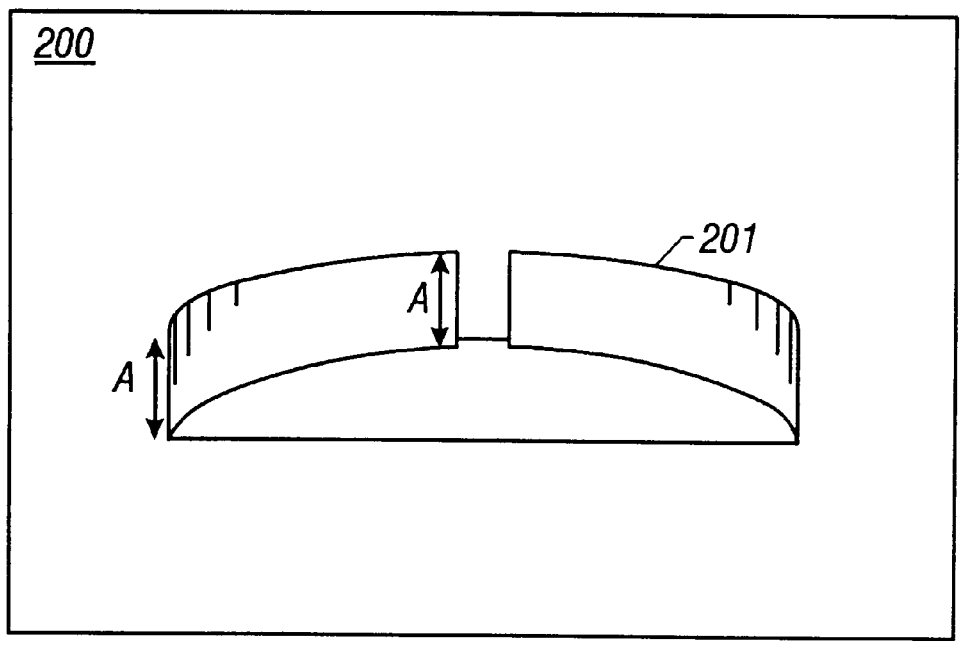
FIG. 2B is a close up view of a surface of the PC peripheral device frame of FIG. 2A with a prior art lance incorporated thereon.
Figure 2A:
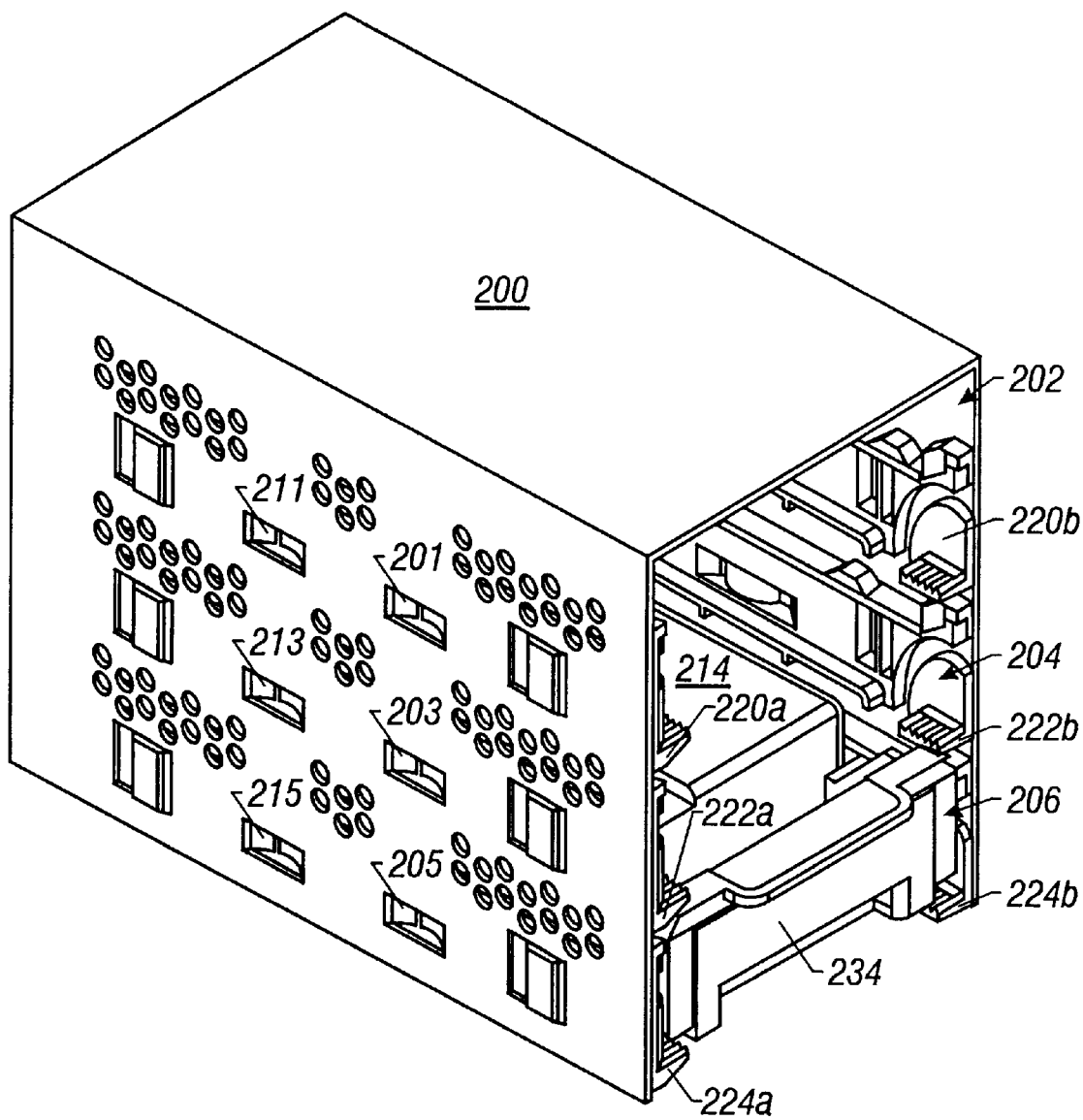
FIG. 2A is a perspective illustrating an exemplary PC peripheral device frame with multiple bays with mounting rails and with a hard drive chassis carrier inserted therein.

Referring to FIG. 2A, frame 200 includes a plurality of bays 202, 204, 206. Each of bays 202, 204, 206 substantially incorporates the carrier-based mounting structure described in U.S. Pat. No. 5,668,696, entitled "Carrier-Based Mounting Structure for Computer Peripheral Chassis," filed Jul. 10, 1995, naming Ty Schmitt as inventor, and which is incorporated herein by reference in its entirety. Only the bay 206 is actually shown as containing a hard disk drive chassis 214. Each bay 202, 204, 206 has mounted therein a pair of mounting rails 220a, 220b, 222a, 222b, 224a, 224b. The mounting rails 220a, 220b cooperate to provide a guide path within the bay 202 for a chassis carrier such as chassis carrier 234 in bay 206. Likewise, the mounting rails 222a, 222b and the mounting rails 224a, 224b cooperate to provide guide paths in the bays 204, 206 respectively, for other chassis carriers, including a chassis carrier 234 shown in a mounted position within the bay 206 and cradling the hard disk drive chassis 214. Details concerning specific features of the mounting rails 220a, 220b, 222a, 222b, 224a, 224b and the chassis carrier 234 will follow with reference to subsequent figures. An exemplary hard drive carrier is described in U.S. Pat. No. 5,652,695, entitled "Hard Drive Carrier Design Permitting Floating Retention of a Connector Assembly to Facilitate Blind Mating of the Connector Assembly in a Hard Drive Bay," filed May 5, 1995, naming Ty Schmitt as inventor, and which is incorporated herein by reference in its entirety.

Frame 200 includes split lances 201, 203, 205, 211, 213, 215 for each of bays 202, 204, 206, respectively. In one embodiment, split lances 201, 203 and 205 provide static discharge of an electronic device as it is installed in the respective bay, and split lances 211, 213, 215 provide a grounding contact for electronic devices installed in the respective bays. Split lances 201, 203, 205, 211, 213, 215 mate with mounting rails 220a, 220b, 222a, 222b, 224a, 224b. For example, split lances 201, 211 protrude through apertures in mounting rail 220a. Split lances 201, 211 securely locate and hold mounting rail 220a and bear the weight of mounting rail 220a and the weight of an electronic device and chassis carrier when such are installed in bay 202. When an electronic device chassis carrier is installed in bay 202, a metal contact initially touches split lance 201 to provide a discharge of electrostatic buildup and ultimately touches split lance 211 to provide a ground connection.

Referring to FIG. 2B, a close-up view of one of lances 201, 203, 205, 211, 213, 215 is shown. By splitting the lance in half the lance can extend the required distance to contact the electronic device chassis without necking down. The sheet metal lance is first cut in half. Then, the sheet metal lance is formed into the required shape; that is, it is deflected from the plane of the sheet metal in a curved fashion so that it can contact an electronic device chassis to discharge and ground it and so that it can be used to securely locate and bear a mounting rail which is placed over the split lance. The result is a feature which is very strong, precise in dimension, can extend farther from the parent chassis or frame than conventional lances, and is easily manufactured. Furthermore, by eliminating several different features and encompassing them all into one easily manufactured design, there are fewer features to be measured, fewer items which can become damaged, and a resulting savings in cost during manufacturing.

Figure 3:
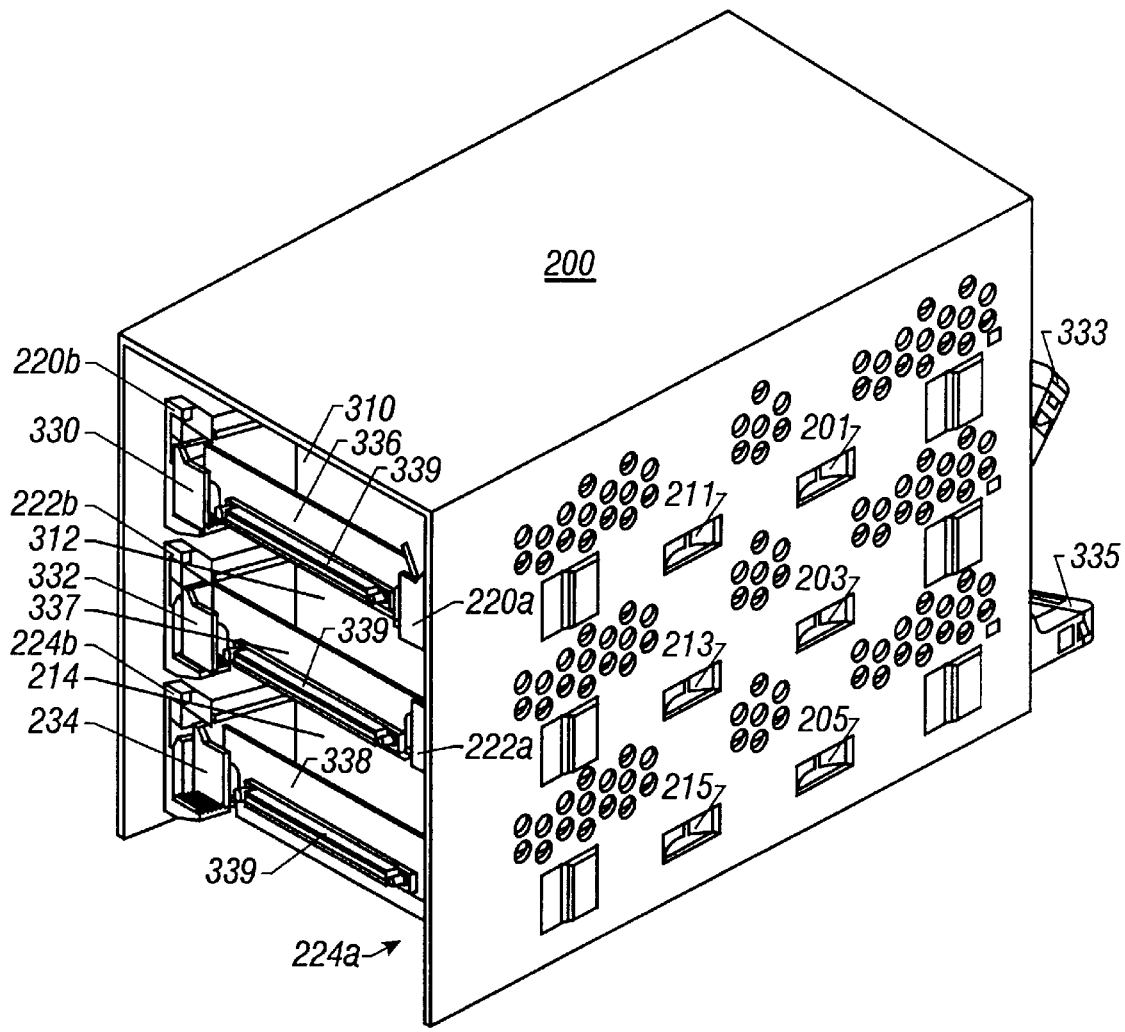
FIG. 3 is a reverse-angle perspective illustrating an exemplary PC peripheral device frame structure having split lances.

FIG. 3 shows a reverse-angle isometric view of the frame 200 of FIG. 2A wherein the bays 202, 204, 206 contain a plurality of hard disk drives 310, 312, 214 cradled within corresponding chassis carriers 330, 332, 234. A mounting handle associated with the chassis carrier 330 is hidden in FIG. 3.

FIG. 3 shows circuit boards 336, 337, 338, associated with each of the chassis carriers 330, 332, 234. Certain types of chassis, for instance those containing hard disk drives for computer systems have circuit boards associated therewith that contain interface hardware allowing communication of data between the hard disk drive and the computer system. The illustrated embodiment makes provision for the associated circuit boards 336, 337, 338 on the chassis carriers 330, 332, 234 and further provides an electrical ground (in a manner to be further detailed) for each of the circuit boards 336, 337, 338. Lances 211, 213, 215 associated with the bays 202, 204, 206 effect this electrical ground. (FIGS. 7A–7D show further views of a computer system frame including split lances as described herein.)

The installation of a chassis carrier and a corresponding electronic device carried by the chassis carrier (electronic device carrier assembly) into frame 200 is fully described and illustrated in the above referenced and incorporated U.S. Pat. No. 5,668,696. Generally, when it is desired to mount a chassis (e.g., hard disk drive chassis 214) within a bay (e.g., the bay 206) in frame 200, a user should first engage first and second carrier guide rails of the chassis carrier 234 with corresponding first and second mount guide rails of the mounting rail 224a. Once engaged, the first and second carrier and mount guide rails provide a substantially linear path for the chassis carrier 234 as it traverses the bay 206. Before the chassis carrier 234 reaches its mounted position, however, a cam and gear arrangement comes into play. The cam and gear arrangement provides mechanical advantage for the user to mount the chassis carrier completely, and is fully described in the above referenced patent.

Electrical connectors 339 associated with each of the circuit boards 336, 337, 338, provide electrical connections between the electronic equipment cradled in the chassis carriers 330, 332, 234 and other electronic equipment (such as data processing and storage circuitry and a power supply, in the case of a network server). The electrical connectors 339 have significant insertion and separation forces associated therewith, as those of ordinary skill in the art understand. The cam and gear arrangement of the present invention, which comes into play near the end of the chassis carrier's travel and as the electrical connector 339 begins to mate, provides mechanical advantage to the user, thereby diminishing the force necessary to overcome the electrical connector's resistance to insertion or separation. Mounting of the chassis carrier 234, for example, is completed by fully rotating mounting handle/door 335 into its mounted (closed) orientation. The retention structure therefore maintains the chassis carrier 234 in its mounted position. To dismount the chassis carrier 234, the mounting handle/door 335 is rotated into its insertion (open) orientation. This separates the electrical connector 339 and places the chassis carrier in condition to be slid outwardly from frame 200. (See FIG. 7C.) An exemplary carrier door and bay filler combination is described in U.S. Pat. No. 5,586,003, entitled "Computer Device Carrier Door and Bay Filler Panel Combination Including Gear and Guide Pin," filed Jun. 7, 1995, naming Ty Schmitt and Jerry Gandre as inventors, and which is incorporated herein by reference in its entirety.

Figure 4A:
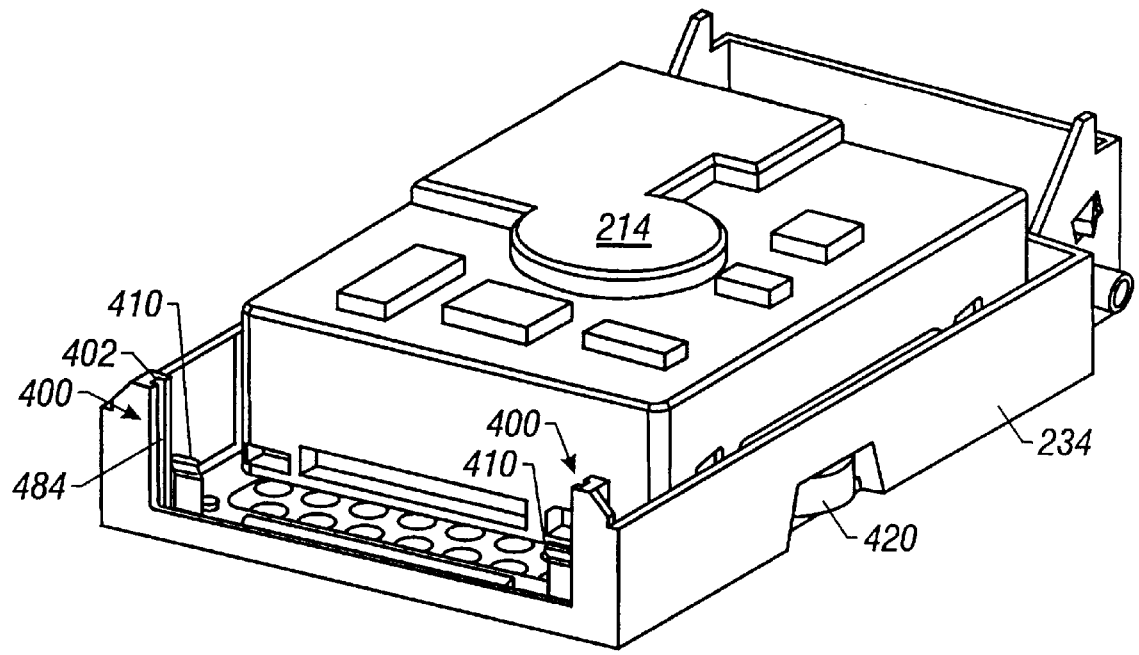
FIG. 4A is a reverse-angle perspective view illustrating an exemplary chassis carrier having a hard disk drive chassis cradled therein.

FIG. 4A shows a reverse-angle isometric view of the chassis carrier 234 and hard disk drive chassis 214 of FIG. 2A showing, in particular, a circuit board slot 400 and grounding clips 410 associated with the chassis carrier. The grounding clips 410 resiliently bear against the circuit board 338, maintaining electrical contact therewith for grounding and EMI suppression purposes, and also providing spring forces necessary for the board to float in the carrier. Electrical contact between the grounding clips 410 and the frame 200 (of FIG. 2A) is maintained by two resilient contacts 420 (only one of which is illustrated) that extend laterally from a side wall of the chassis carrier 234 to contact corresponding lances 201, 203, 205, 211, 213, 215 of the frame 200.

Figure 4B:
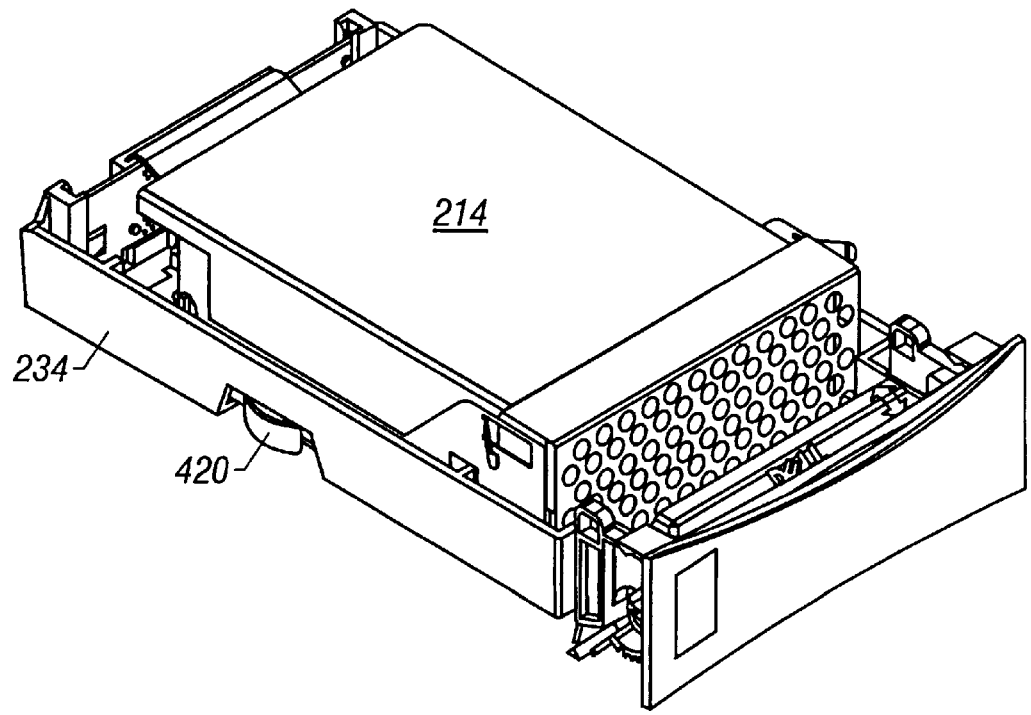
FIG. 4B is a perspective view illustrating an exemplary chassis carrier having a hard disk drive chassis cradled therein.

FIG. 4B shows a front view of a further exemplary hard drive chassis carrier assembly including chassis carrier 234 and hard disk drive chassis 214. Chassis carrier 234 cradles electromagnetic interference (EMI) shield 430. EMI shield 430 shields the electronic device from electromagnetic interference while allowing ventilation. Extensions 432 extend to contact the frame to provide additional grounding.

Figure 4C:
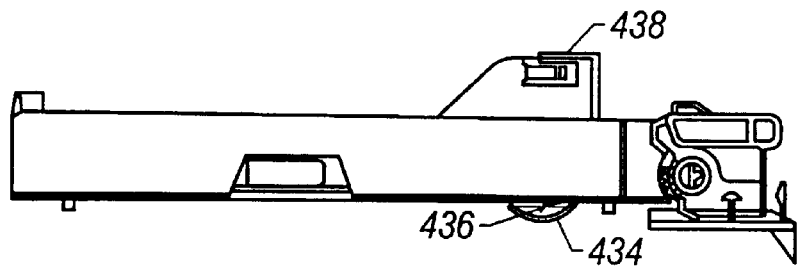
FIG. 4C is a side view (in a tower configuration) of an exemplary hard drive chassis carrier assembly.
Figure 4D:
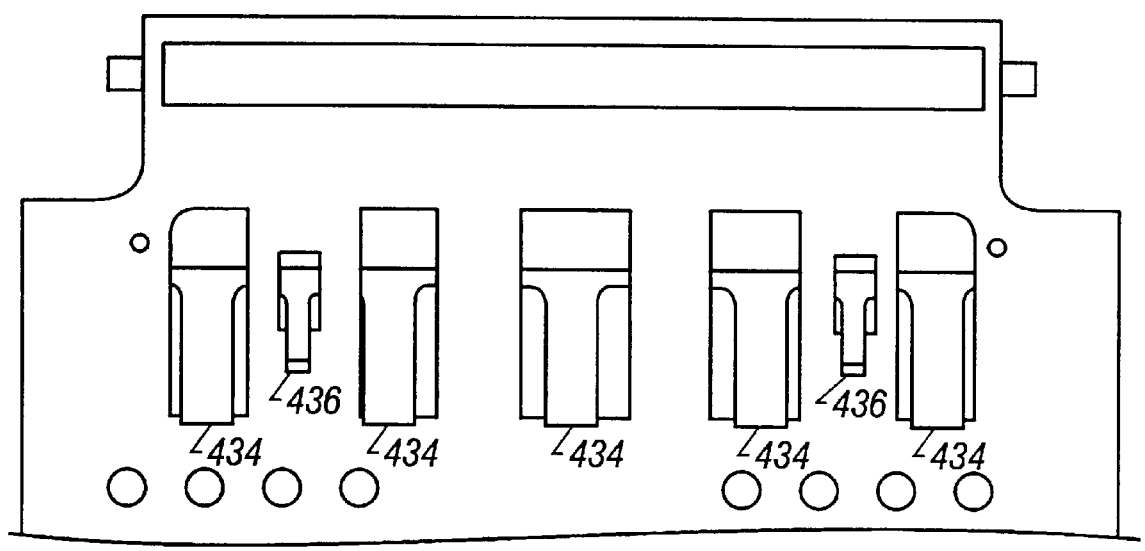
FIG. 4D is a partial bottom view of a chassis carrier showing EMI shield fingers and clips protruding from the bottom of the chassis carrier.

FIG. 4C shows a side view (in a tower configuration) of the exemplary hard drive chassis carrier assembly. Clips 436 hold EMI shield 430 onto chassis carrier 234. Fingers 434 of EMI shield protrude through and extend from the bottom of chassis carrier 234. When chassis carrier 234 is installed in a computer system, fingers 434(n) extend to electrically couple with the top 438(n-1) of an EMI shield on an adjacent (below) chassis carrier 234(n-1) or the frame of the computer system. When chassis carrier 234 is installed in a computer system, EMI shield top 438(n) is electrically coupled to fingers 434(n+1) of an EMI shield on an adjacent (above) chassis carrier 234(n+1). FIG. 4D is a partial bottom view of chassis carrier 234 showing fingers 434 and clips 436 protruding from the bottom of chassis carrier 234. (The directions given herein are exemplary. For example, in a desktop configuration, the vertical reference directions given above convert to corresponding horizontal reference directions.)

Figure 5:
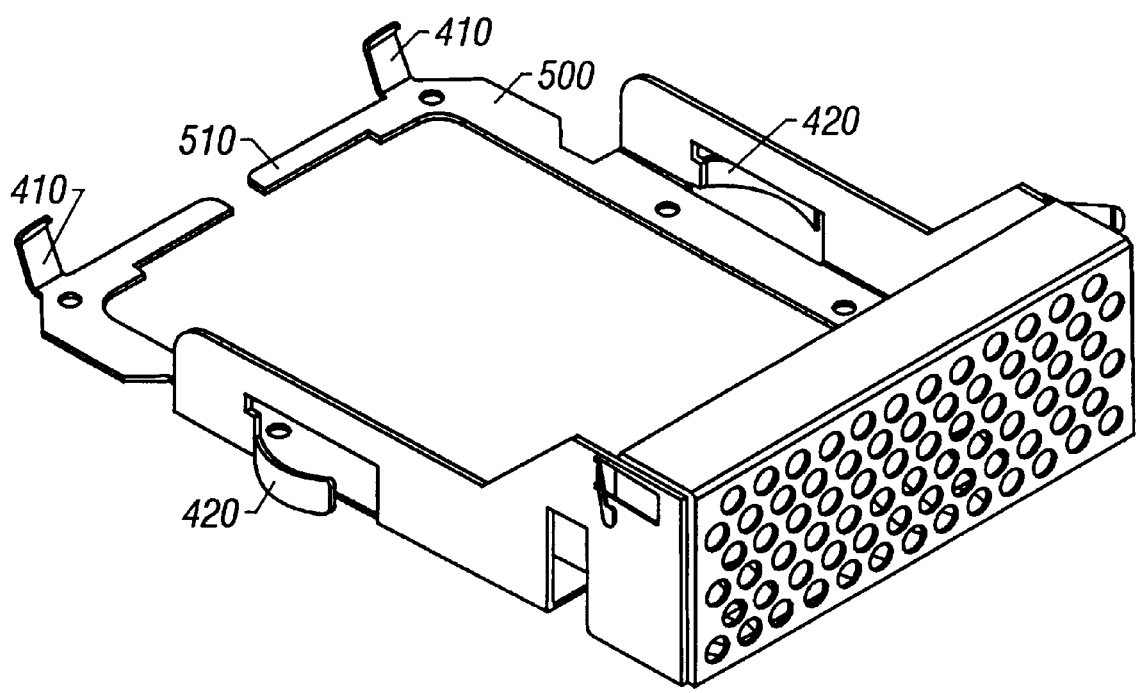
FIG. 5 is a perspective view of a grounding conductor which is mounted inside the chassis carrier.

FIG. 5 shows an isometric view of a grounding conductor and EMI shield structure which includes a grounding conductor 500 and an EMI shield 430. One embodiment of the invention only includes a grounding conductor without an EMI shield. The grounding conductor 500 contains the grounding clips 410 and the resilient contacts 420 that electrically couple the circuit board to the frame. Further, a base plate 510 contacts the hard disk drive chassis 214 (not shown) to ground the same. The grounding conductor is designed to fit within a cradle formed by each of chassis carriers 330, 332, 234. EMI shield 430 includes top portion 438 for electrically coupling to fingers of an adjacent EMI shield and fingers 434 for electrically coupling to a top portion of an adjacent EMI shield to form a contiguous EMI shield across the front of the peripheral device bays.

FIG. 6A shows an isometric view of a mounting rail (such as the mounting rail 220a) used in one embodiment. The various features and functionality of mounting rail 220a is fully described and illustrated in the above referenced U.S. Pat. No. 5,668,696. Mounting rail 220a is universally mountable to either side of the bays 202, 204, 206. A mount guide rail 601 is engageable with a corresponding chassis carrier guide rail (not shown) to allow the associated chassis carrier to traverse the bay. Through-holes or apertures 600 allow the lances 201, 203, 205, 211, 213, 215 of FIG. 2 to pass therethrough to contact the resilient contacts 420 (FIGS. 4 and 5) to make electrical contact therewith.

Figure 6B:
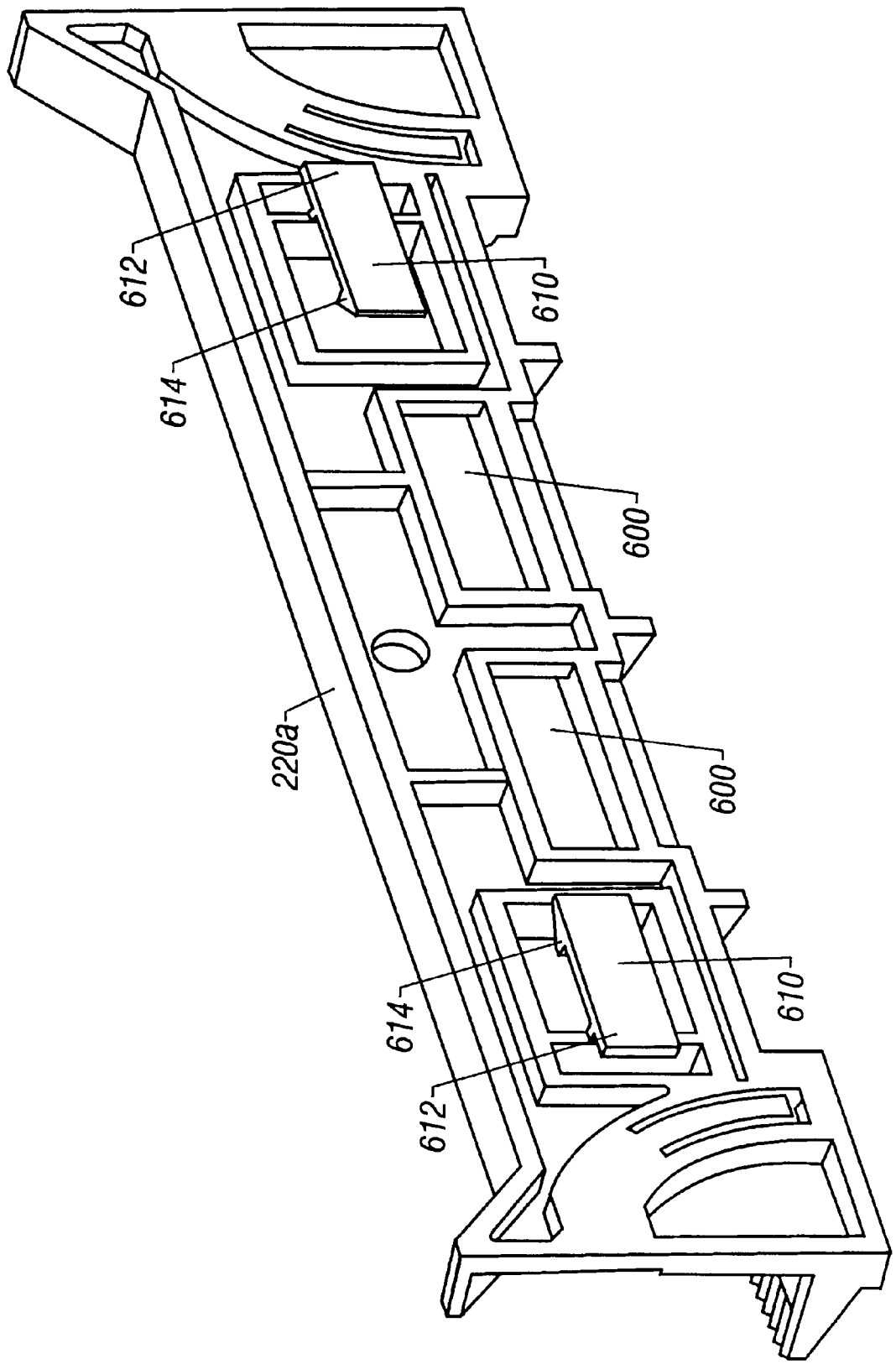
FIG. 6B is a reverse-angle perspective view of the mounting rail of FIG. 6A which is attached to the frame structure.

FIG. 6B shows a reverse-angle isometric view of the mounting rail of FIG. 6A. In addition to those features described with respect to FIG. 7, FIG. 8 shows clips 610 adapted releasably to couple the mounting rail 220a to the walls of each bay 202, 204, 206. Each clip 610 has a camming shoulder 612 and a snap 614 associated therewith. In the illustrated embodiment, since the mounting rail 220a is universal, the camming shoulder 612 of one clip 610 cooperates with the snap 614 of the other clip 610 to secure the mounting rail 220a to the frame 200.

Figure 6C:
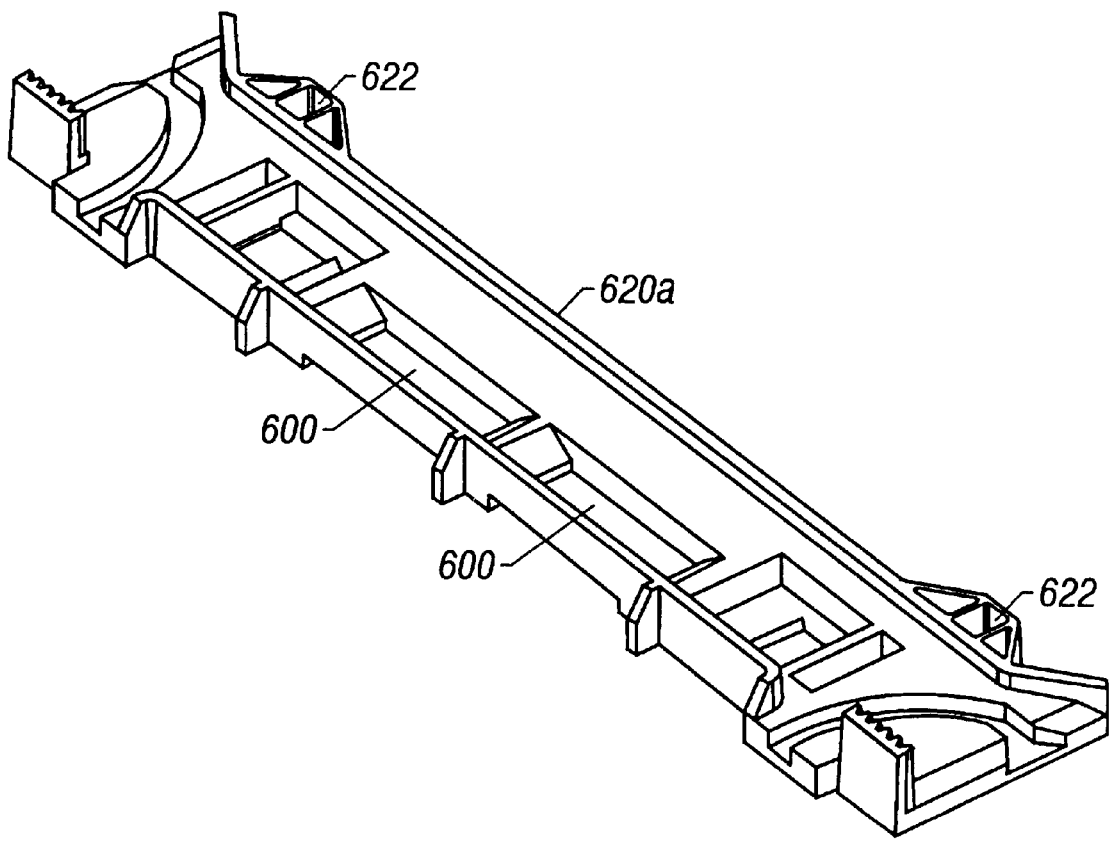
FIG. 6C is a perspective view of an exemplary mounting rail which is attached to the frame structure.

FIG. 6C shows a bottom isometric view of one embodiment of a mounting rail 620a. Mounting rail 620a includes locking or retaining pin apertures 622 to lock a carrier bay door. An exemplary embodiment of mounting rail 620a is described in copending U.S. patent application Ser. No. 08/963,788, entitled "Mounting Rail Retaining Pin Aperture," filed on even date herewith, naming Ty Schmitt, Arthur Lopez and Steven L. Sands as inventors, which is incorporated by reference herein in its entirety, and which is a continuation-in-part of copending U.S. patent application Ser. No. 08/748,850, entitled "Locking Apparatus for Disk Drive Carriers," filed Nov. 14, 1996, naming Arthur Lopez and Steven L. Sands as inventors, and which is incorporated herein by reference in its entirety.

Figure 7A:
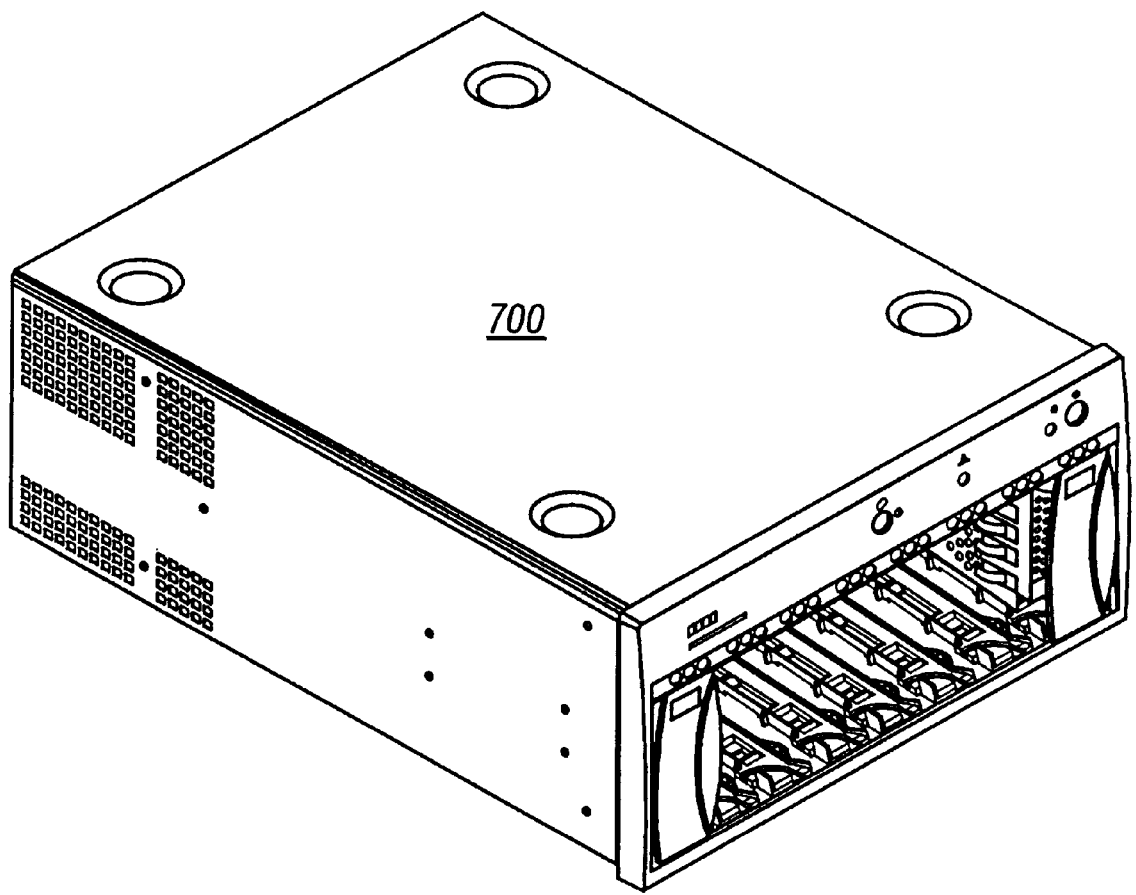
FIG. 7A is a perspective view illustrating an exemplary PC peripheral device frame with multiple bays with mounting rails and with two hard drive carrier assemblies inserted therein.
Figure 7B:
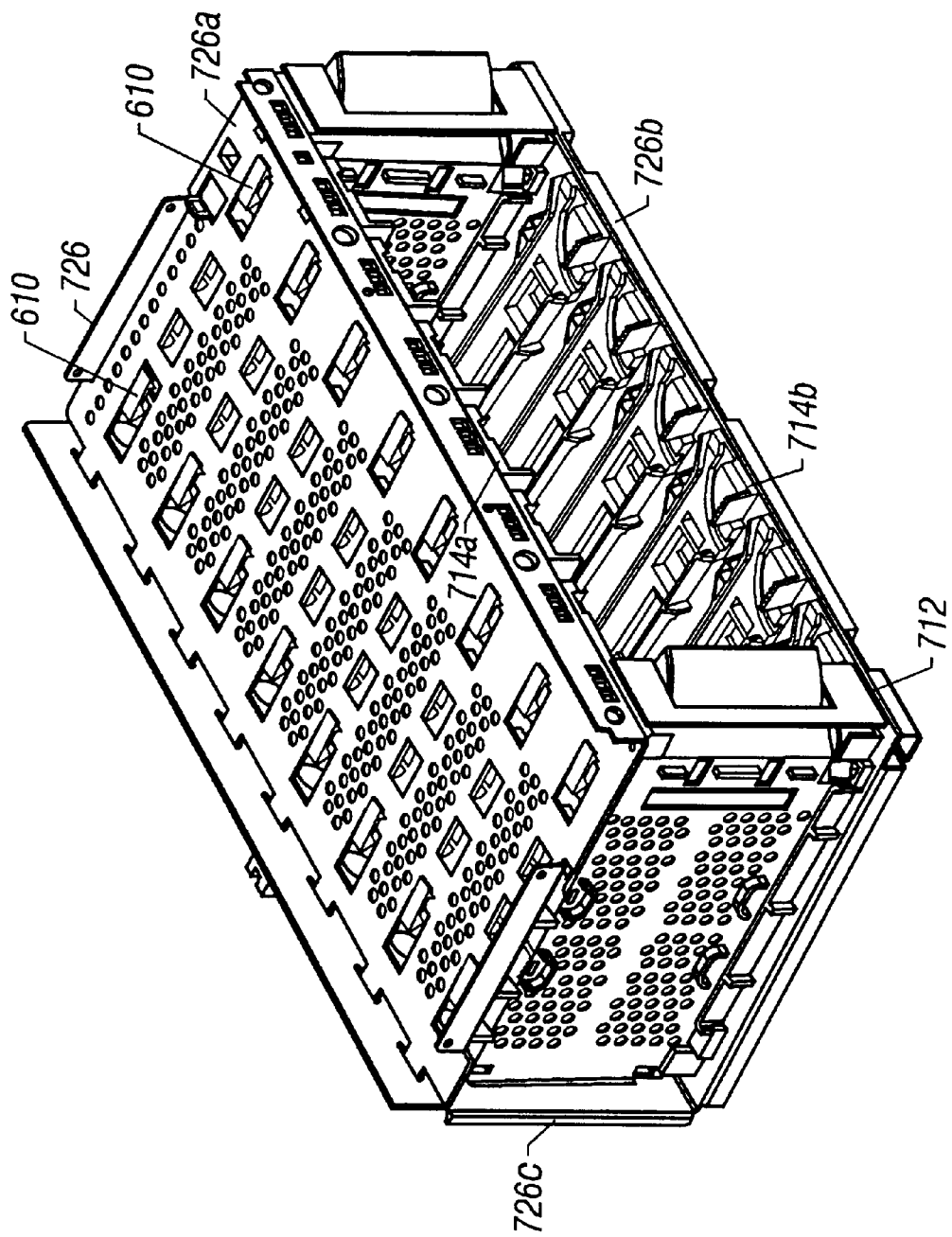
FIG. 7B is a perspective view of the PC frame of FIG. 7A showing the split lances.

FIG. 7A is a perspective illustrating an exemplary PC frame 700 with multiple bays with mounting rails and with two hard drive chassis carrier inserted therein. FIG. 7B presents a similar view of frame 700 with an outer casing removed. Referring to FIG. 7B, frame 700 is comprised of two sides 726a, 726b and back 726c. As shown, pairs of mounting rails 714 (e.g., 714a and 714b) are secured opposite each other, one to each side 726a, 726b, within the frame 700 to form a bay. A door/filler 712, with or without a carrier, is then attached to the mounting rails 714 as described above, such that the door/filler 712 seals the bay opening in the frame 700 when the door/filler 712 is closed.

Figure 7C:
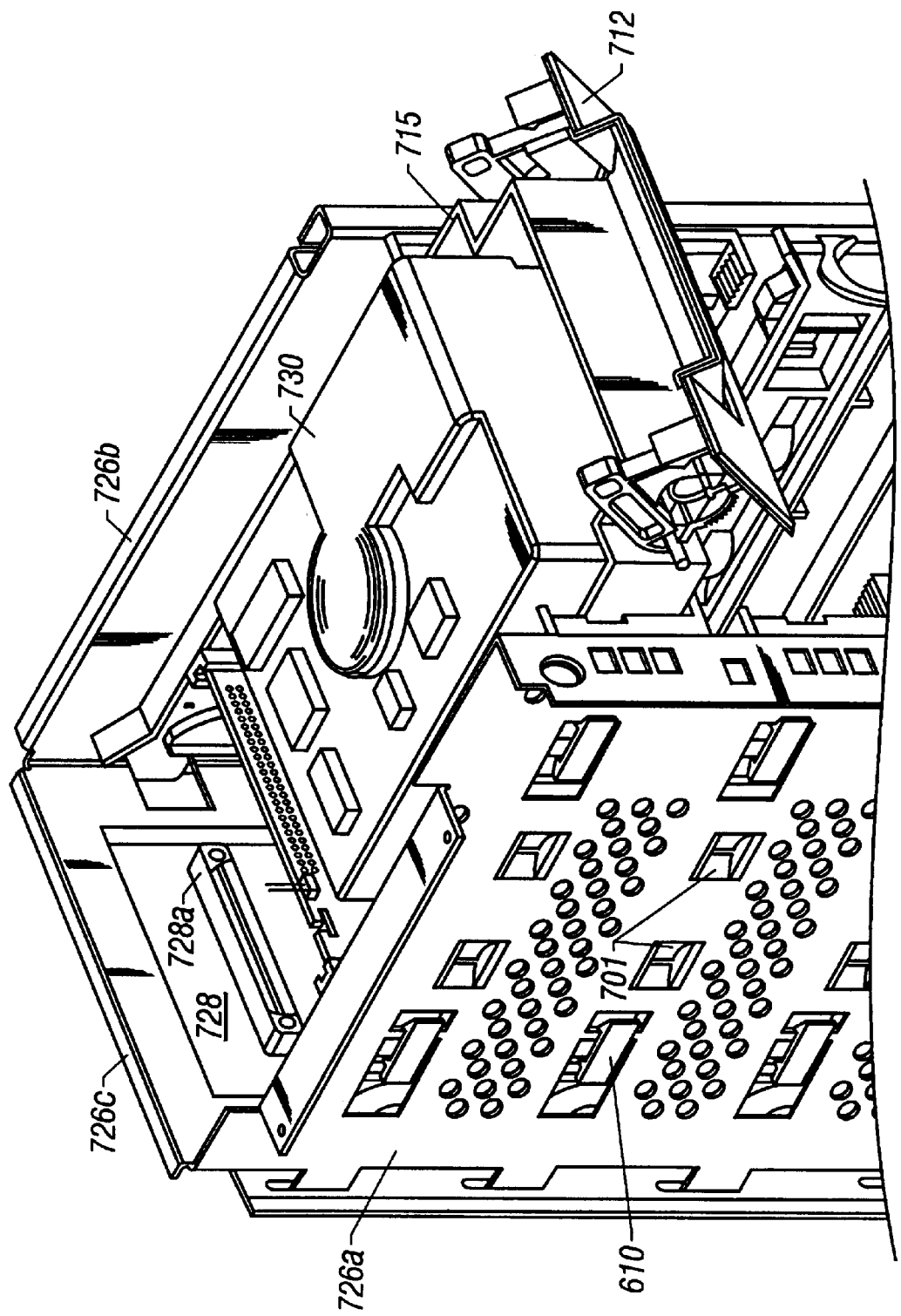
FIG. 7C is a partial overhead view of the PC frame of FIG. 7B showing the split lances and showing the attached carrier partially removed from the frame and disconnected from the backplane circuit board.

FIG. 7C is a partial overhead view of frame 700 in a computer chassis with the attached carrier partially removed from the computer chassis. As shown, a system board or backplane printed circuit board (PCB) 728 with an attached system board connector 728a is secured at the back 726c of frame 700. Also shown is a computer device 730, such as a hard drive or other storage or I/O device, secured within carrier 715. As discussed above, the carrier 715 is inserted into the mounting rails and slid relative to the mounting rails until the door/filler 712 engages the mounting rails. By closing the door/filler 712 as described above, a device connector (not shown) at the back of the carrier 715 is inserted into the connector 728a, thus electrically connecting the device 730 to the backplane PCB 728. By opening the door/filler 712 as described above, the device connector is removed from connector 728a, disconnecting the device 730 from the backplane PCB 728 and allowing the device 730 and carrier 715 to be removed from frame 700.

Figure 7D:
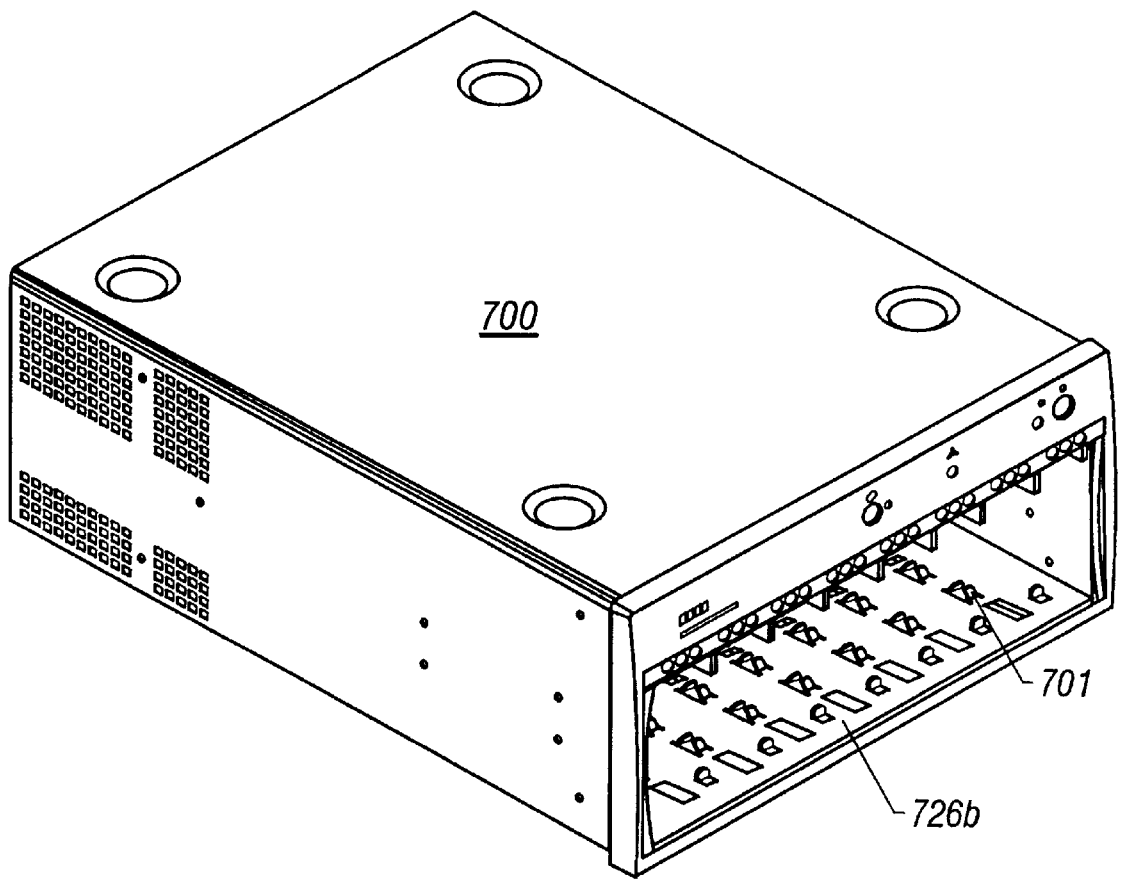
FIG. 7D is a perspective view of the PC frame of FIG. 7A without the mounting rails and showing the split lances incorporated therein.
Figure 7E:
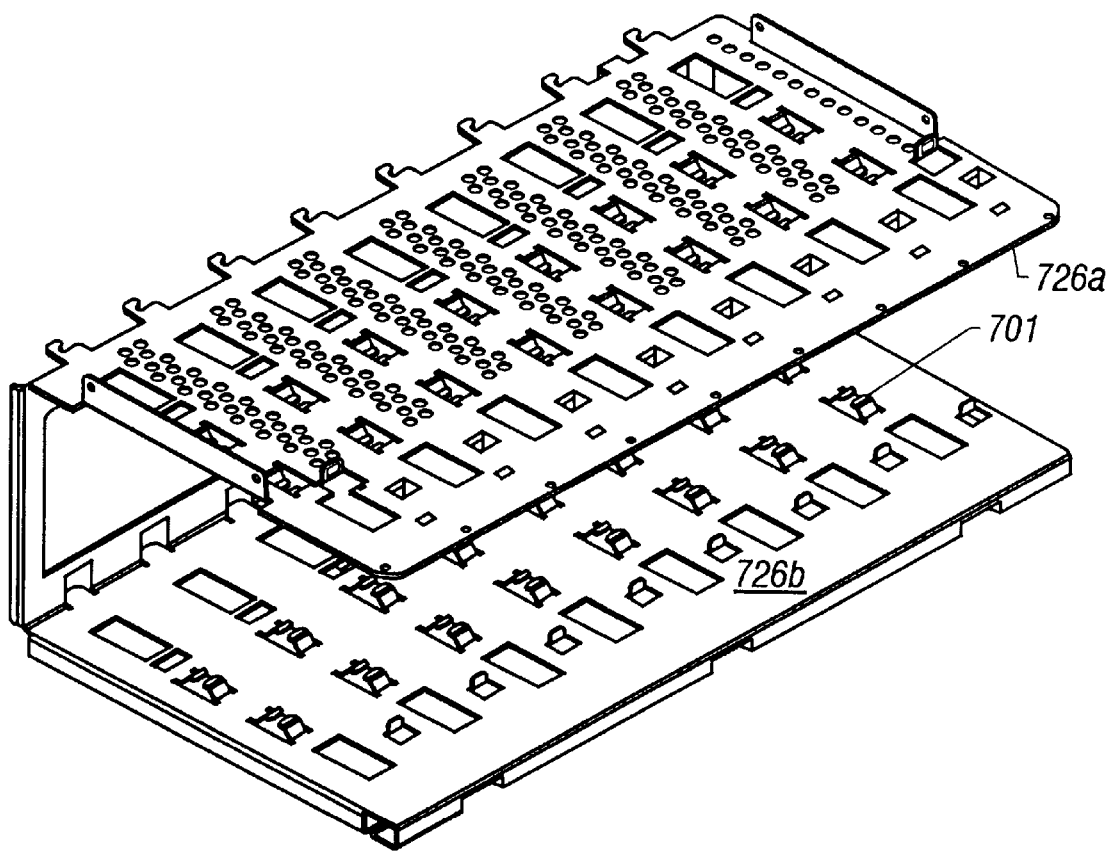
FIG. 7E is a perspective view of the inner surface of the PC frame of FIG. 7D more clearly showing the split lances incorporated therein.
Figure 7F:
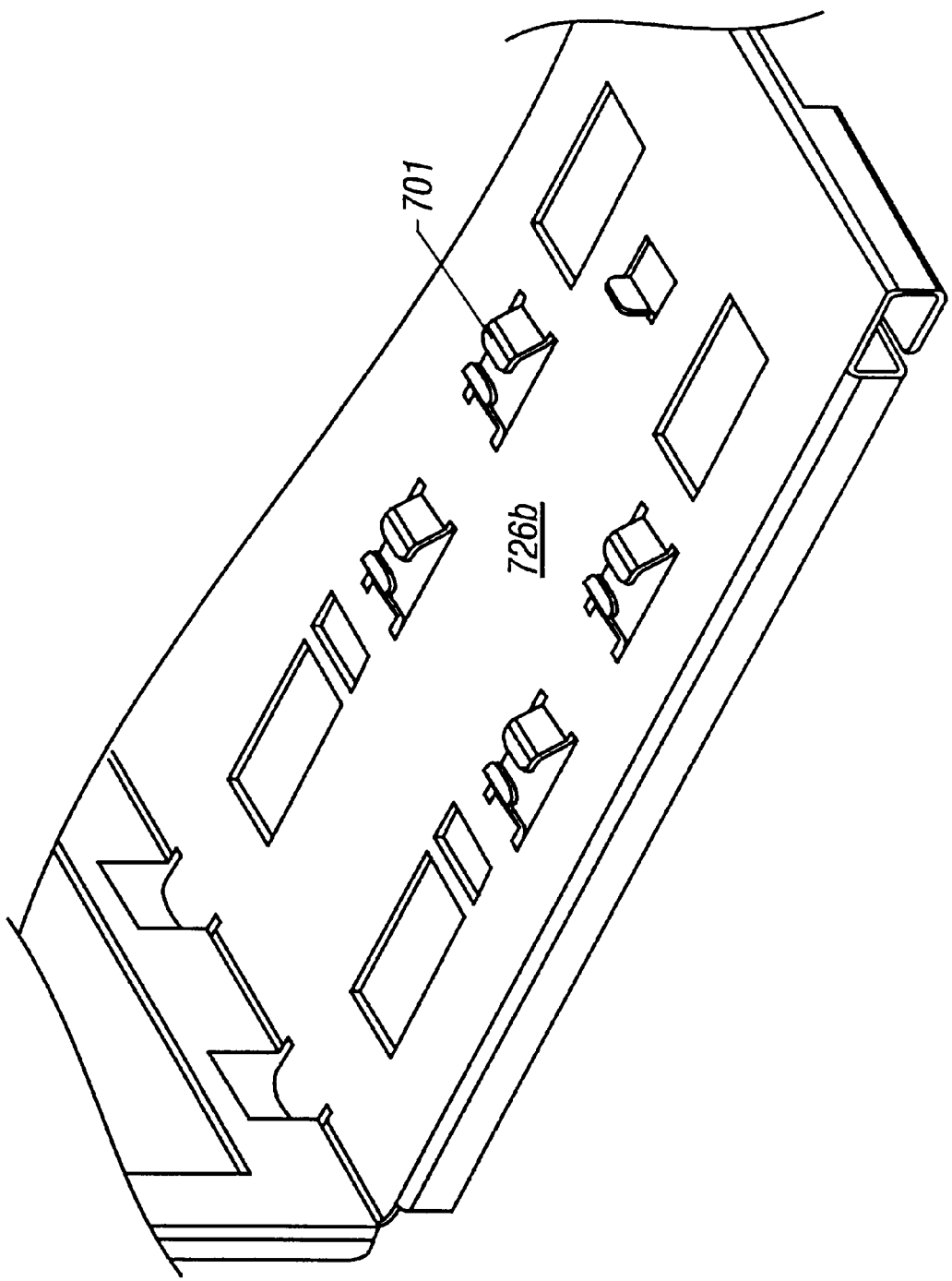
FIG. 7F is a close up view of the split lances of the inner surface of the PC frame of FIG. 7E.
Figure 7G:
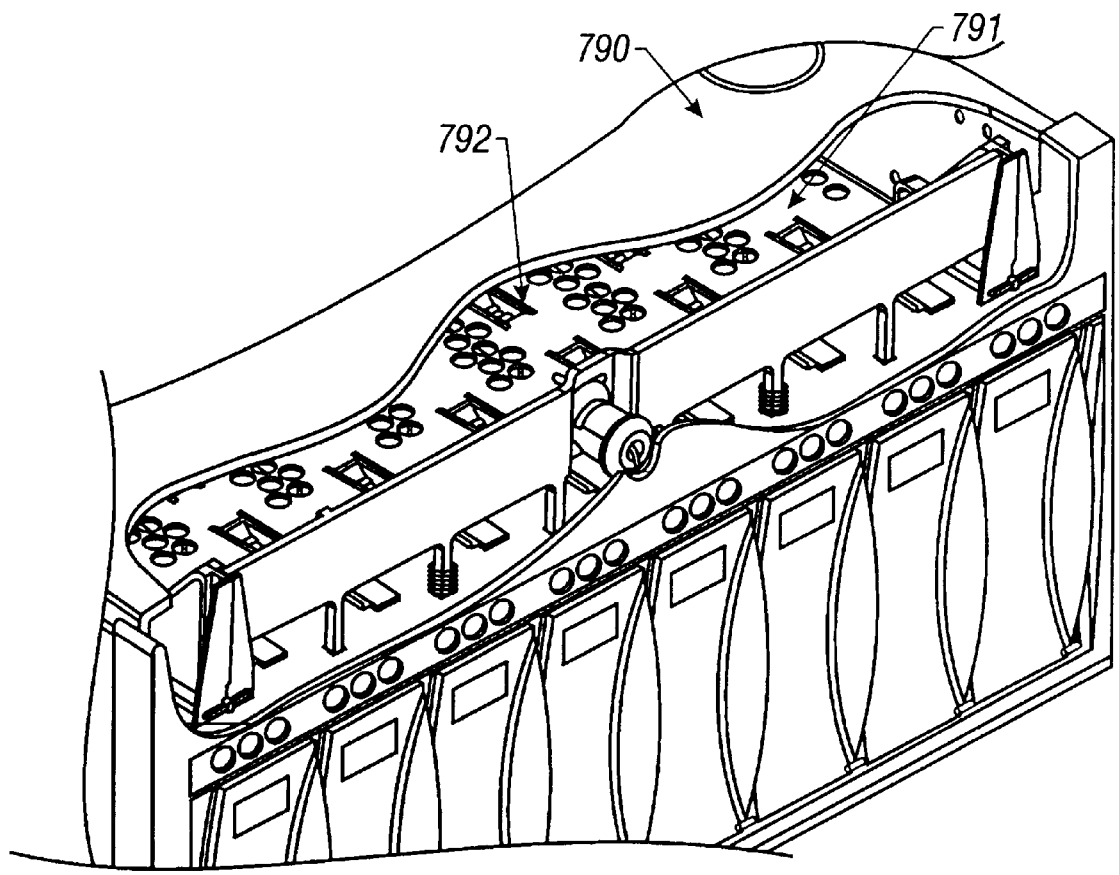
FIG. 7G is a perspective cut-away view of a computer system frame showing split lances of the surface of the PC frame.

FIG. 7D is a perspective view of the PC frame of FIG. 7A without the mounting rails and showing the split lances 701 incorporated therein. FIG. 7E is a perspective view of the inner surface 726 of the PC frame of FIG. 7D more clearly showing the split lances 701 incorporated therein. FIG. 7F is a close up view of the split lances 701 of the inner surface 726b of the PC frame of FIG. 7D. FIG. 7G is a perspective view of a computer system exterior case 790 having a cut-away showing split lances 792 extending from the surface of the PC frame 791 into the interior of the PC frame and contacting installed electronic device chassis carrier assemblies.

Thus, split lance features are provided in a removable electronic device bay of a computer system. The split lance features have the significant advantage that an electronic device (such as a hard drive) or a chassis or chassis carrier therefor may be reliably and repeatedly located in the computer system. In prior art systems, the formation of a non-split lance resulted in unpredictable necking down of each non-split lance as the metal was stretched to form the lance. The present invention solves the necking down problem by providing split lances. Because the split lances do not neck down during formation, the width of the split lances may be more accurately controlled, thereby allowing the split lances to be used to reliably locate a mounting device and/or chassis carrier within the computer system peripheral device bay. The split lances are used as a very precise mechanical alignment feature to guide the mounting rails onto the frame at a precise location.

Furthermore, in the above described embodiment, an electronic device, chassis or chassis carrier is advantageously located and constrained to the chassis or frame of the computer system peripheral device bay without the use of fasteners or multiple parts. The ability to use the split lances to reliably locate the mounting rails and to bear the weight of the installed electronic device, chassis and carrier eliminates the use of additional parts. Saving internal computer system space is a significant advantage because the sizes of computer systems are decreasing and the complexity of computer systems are increasing. Also, using fewer part decreases manufacturing complexity and increases speed of manufacturing. Also, because the split lances provide a load bearing feature, the electronic device, chassis and carrier may be shipped installed in the bay of the computer system.

In one embodiment, the split lance features mate with snap or aperture features of a mounting rail fastened thereto and are formed so as to provide static discharge and ground to an electronic device chassis carrier when the electronic device chassis carrier. That is, when the electronic device chassis carrier is installed into the peripheral device bay of the computer system, a first set of split lances electrically contact the electronic device chassis carried by the chassis carrier to wipe any electrostatic buildup, and a second set of split lances electrically contact the electronic device chassis to electrically connect the electronic device chassis to the ground of the computer system. Such an embodiment improves protection from electromagnetic interference and radio frequency interference, and improves containment.

While the invention has been described with reference to various embodiments, it will be understood that these embodiments are illustrative and that the scope of the invention is not limited to them. Many variations, modifications, additions, and improvements of the embodiments described are possible. For example, alternative embodiments may combine multiple instances of a particular component. Also, other embodiments may change the shape of the split lances in aesthetic ways without altering the functionality of the split lances and without deviating from the claimed invention. These and other variations, modifications, additions, and improvements may fall within the scope of the invention as defined in the claims which follow.

What is claimed is:

1. A frame and mounting apparatus for use in a computer peripheral device bay, comprising:
   a frame having a surface and a split lance extending from the surface of the frame to an interior side of the frame;
   a mounting rail coupled to the surface of the frame on the interior side of the frame, the mounting rail having at least one aperture allowing the split lance to pass therethrough, the mounting rail having a location determined by the location of the split lance.

2. An apparatus as recited in claim 1, further comprising:
   a carrier body coupled to the apparatus, the carrier body having a location determined by the location of the mounting rail.

3. An apparatus as recited in claim 2, wherein the carrier body has an electronic device disposed thereupon.

4. An apparatus as recited in claim 3, wherein the electronic device is a hard drive.

5. An apparatus as recited in claim 1, wherein
   the split lance is a first split lance and the mounting rail is a first mounting rail;
   the frame includes a second split lance extending from the surface of the frame to an interior side of the frame opposite to the first split lance;
   the apparatus includes a second mounting rail coupled to the surface of the frame on the interior side of the frame opposite the first mounting rail, the second mounting rail having at least one aperture allowing the second split lance to pass therethrough, the second mounting rail having a location determined by the location of the second split lance.

6. An apparatus as recited in claim 5, further comprising:
   a carrier body coupled between the first and second mounting rails.

7. An apparatus as recited in claim 6, wherein the carrier body has an electronic device disposed therein.

8. An apparatus as recited in claim 7, wherein the electronic device is a hard drive.

9. An apparatus as recited in claim 1, wherein the split lance grounds the electronic device when the electronic device is installed in the frame.

10. An apparatus as recited in claim 1, wherein the split lance discharges electrostatic buildup of the electronic device when the electronic device is installed in the frame.

11. An apparatus as recited in claim 1, wherein the split lance bears the weight of the mounting rail.

12. An apparatus as recited in claim 1, wherein the frame and split lance are comprised of sheet metal.

13. A computer system comprising:

a backplane printed circuit board;

a peripheral device coupled to the backplane printed circuit board wherein the peripheral device is cradled within a chassis carrier;

a grounding conductor associated with the chassis carrier and peripheral device;

a frame structure for supporting the chassis carrier, the frame structure comprising:

a plurality of peripheral device bays for receiving peripheral devices, one of the plurality of peripheral device bays including the peripheral device and chassis carrier;

a plurality of split lances located on opposite internal sides of the frame structure for each peripheral device bay, at least one split lance coupling the at least one peripheral device to ground via the associated at least one grounding connector.

14. A computer system as recited in claim 13, wherein mounting rails are coupled to at least some of the split lances, the mounting rails having a position determined by a location of at least one split lance, at least two of the mounting rails supporting the weight of the peripheral device and chassis carrier.

15. A computer system as recited in claim 14, wherein each of at least some of the plurality of split lances bears the weight of each of the mounting rails.

16. A computer system as recited in claim 13, wherein the peripheral device is a hard drive.

17. A computer system as recited in claim 13, wherein at least one of the plurality of split lances discharges electrostatic buildup of the peripheral device while the peripheral device is being installed in the frame and before the peripheral device is coupled to the back plane.

18. A computer system as recited in claim 13, wherein the frame and split lance are comprised of sheet metal.

19. A method of grounding and locating a peripheral device in a computer system, the method comprising:

providing a plurality of split lances on an interior surface of the computer system;

installing a peripheral device in the computer system.

20. A method of grounding and locating a peripheral device in a computer system as recited in claim 19, wherein the providing of the split lances on the interior surface of the computer system comprises:

cutting a lance in a sheet metal frame;

cutting the lance in half to form lance halves, each of the lance halves having a width;

forming a split lance by shaping the lance halves away from a plane of the sheet metal frame toward the interior of the computer system, the split lance including a portion having a width that is the same as the width of each of the lance halves so that the split lance may reliably locate peripheral device features in the computer system.

21. A method of grounding and locating a peripheral device in a computer system as recited in claim 19, wherein the installing the peripheral device in the computer system comprises:

electrically coupling a grounding contact of the peripheral device to at least one of the split lances; and locating the peripheral device in a position determined by a location of at least one of the split lances.

22. A method of grounding and locating a peripheral device in a computer system as recited in claim 19, the method further comprising:

providing mounting rails coupled to the interior surface of the computer system, each of the mounting rails located by one of the plurality of split lances;

supporting the weight of the peripheral device by the mounting rails; and supporting the weight of a corresponding mounting rail and peripheral device by at least some of the split lances.

\* \* \* \* \*